US009998137B1

United States Patent
Li et al.

(10) Patent No.: US 9,998,137 B1
(45) Date of Patent: Jun. 12, 2018

(54) POWER-EFFICIENT SUCCESSIVE-APPROXIMATION ANALOG-TO-DIGITAL CONVERTER USING LSB AVERAGING

(71) Applicant: Marvell International Ltd., Hamilton (BM)

(72) Inventors: Xiang Li, San Jose, CA (US); Arvind Anumula Paramanandam, Pleasanton, CA (US); Prasanna Upadhyaya, San Jose, CA (US); Xiaoyue Wang, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days. days.

(21) Appl. No.: 15/706,712

(22) Filed: Sep. 17, 2017

Related U.S. Application Data

(60) Provisional application No. 62/396,472, filed on Sep. 19, 2016.

(51) Int. Cl.
*H03M 1/00* (2006.01)
*H03M 1/46* (2006.01)
*H03M 1/10* (2006.01)
*H03M 1/14* (2006.01)

(52) U.S. Cl.
CPC ......... *H03M 1/462* (2013.01); *H03M 1/1071* (2013.01); *H03M 1/14* (2013.01)

(58) Field of Classification Search
CPC ............ H03M 1/46; H03M 1/10; H03M 1/14; H03M 1/462; H03M 1/1071
USPC .......................... 341/120, 118, 115, 150, 110
See application file for complete search history.

(56) References Cited

U.S. PATENT DOCUMENTS

| 4,325,055 A | * | 4/1982 | Colardelle | H03M 1/40 341/172 |
| 4,947,168 A | * | 8/1990 | Myers | H03M 1/1042 341/120 |
| 5,258,759 A | * | 11/1993 | Cauwenberghs | G11C 11/565 341/150 |
| 6,348,885 B1 | * | 2/2002 | Munoz | H03M 1/0692 341/118 |
| 6,417,794 B1 | * | 7/2002 | Munoz | H03M 1/1061 341/118 |

(Continued)

OTHER PUBLICATIONS

Hong et al., "An 8.6 ENOB 900MS/s Time-Interleaved 2b/cycle SAR ADC with a 1b/cycle Reconfiguration for Resolution Enhancement", Solid-State Circuits Conference Digest of Technical Papers (ISSCC), Session 26, pp. 470-471, year 2013.

(Continued)

*Primary Examiner* — Jean B Jeanglaude

(57) ABSTRACT

An Analog-to-Digital Converter (ADC) device includes an input interface and conversion circuitry. The input interface is configured to receive an analog input signal. The conversion circuitry is configured to convert the analog input signal into a digital word by performing a sequence of iterations to determine respective bits of the digital word, wherein the sequence (i) progresses in descending order of bit significance of the bits, from a Most Significant Bit (MSB) to a Least Significant Bit (LSB), and (ii) repeats evaluation of a predefined number of Least-Significant Bits (LSBs) of the digital word multiple times, and determining a final value of the digital word by averaging the repeatedly-evaluated LSBs.

9 Claims, 3 Drawing Sheets

(56) References Cited

U.S. PATENT DOCUMENTS

| | | | | |
|---|---|---|---|---|
| 6,424,276 B1 * | 7/2002 | Munoz | ............... | H03M 1/1061 |
| | | | | 341/115 |
| 8,421,658 B1 * | 4/2013 | Yau | .................... | H03M 1/1004 |
| | | | | 341/118 |
| 8,922,406 B2 * | 12/2014 | Jansson | .............. | H03M 1/1009 |
| | | | | 341/120 |

OTHER PUBLICATIONS

Verbruggen et al., "A 1.7 mW 11b 250 MS/s 2-Times Interleaved Fully Dynamic Pipelined SAR ADC in 40 nm Digital CMOS", IEEE Journal of Solid-State Circuits, vol. 47, Issue 12, pp. 2880-2887, Dec. 2012.

Chen et al., "A 10.5-b ENOB 645nW 100kS/s SAR ADC with Statistical Estimation Based Noise Reduction", Proceedings of the IEEE Custom Integrated Circuits Conference (CICC), San Jose, California, 4 pages, Sep. 28-30, 2015.

Liu et al., "A 10 bit 320 MS/s Low-Cost SAR ADC for IEEE 802.11ac Applications in 20 nm CMOS", IEEE Journal of Solid-State Circuits, vol. 50, No. 11, 10 pages, Nov. 2015.

Venca et al., "A 0.076mm2 12b 26.5mW 600MS/s $4^x$-interleaved Subranging SAR-ADC with On-Chip Buffer in 28nm CMOS", IEEE International Solid-State Circuits Conference (ISSCC), pp. 470-471, Feb. 2016.

Giannini et al., "An 820µW 9b 40MS/s Noise-Tolerant Dynamic-SAR ADC in 90nm Digital CMOS", IEEE International Solid-State Circuits Conference (ISSCC), Session 12, pp. 238-239, Feb. 2008.

\* cited by examiner

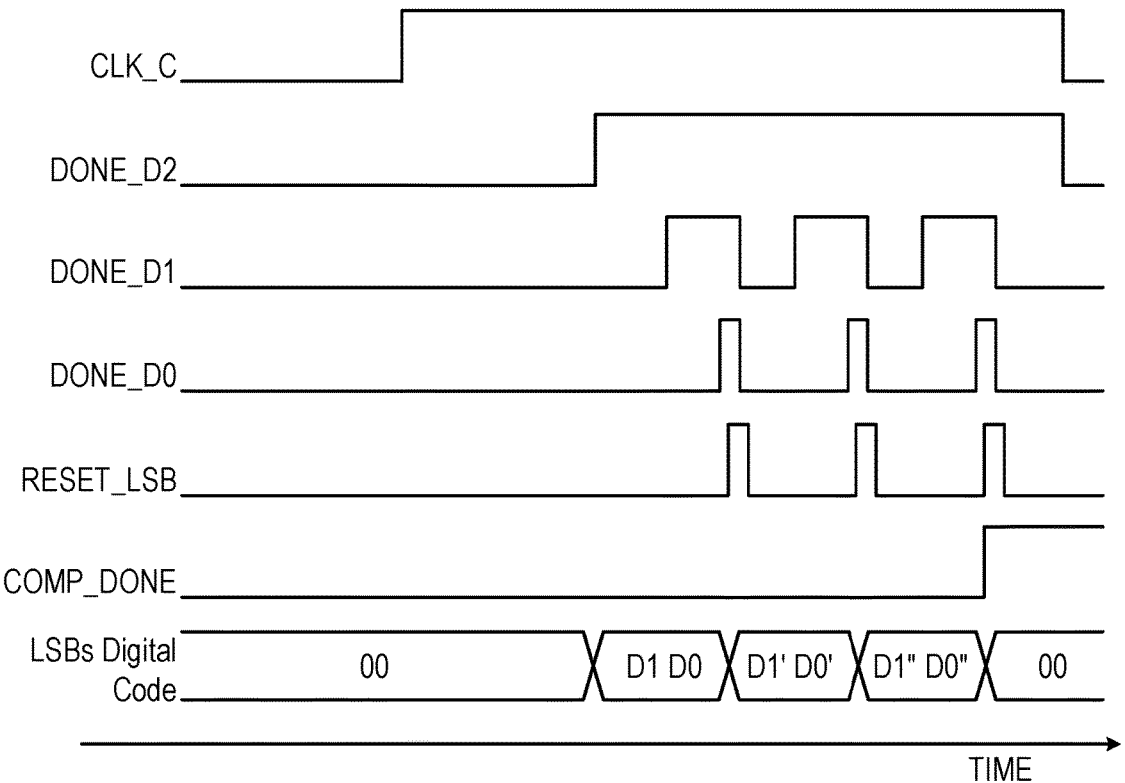
*FIG. 3*
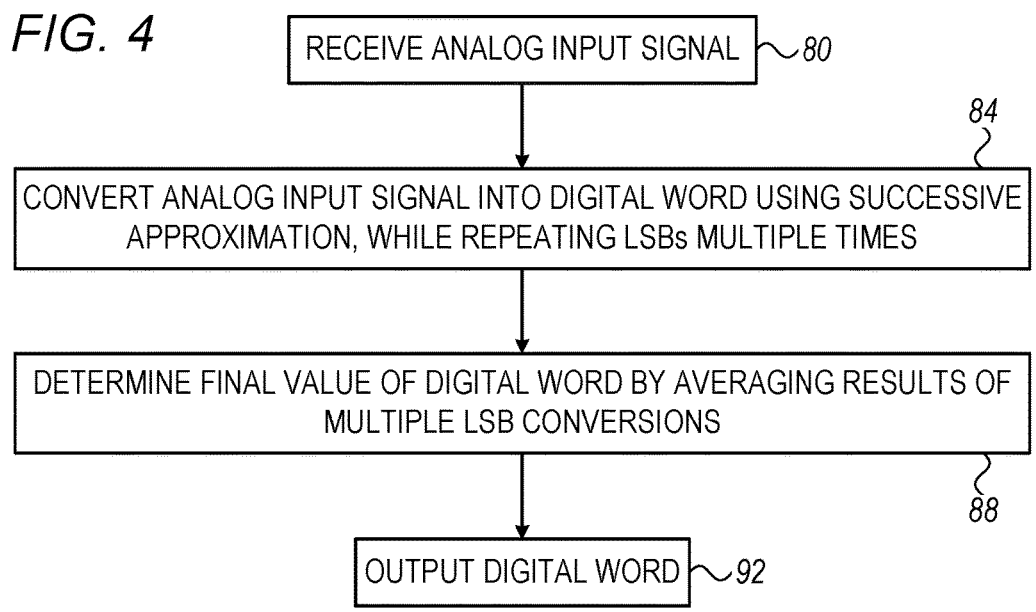

POWER-EFFICIENT SUCCESSIVE-APPROXIMATION ANALOG-TO-DIGITAL CONVERTER USING LSB AVERAGING

CROSS-REFERENCE TO RELATED APPLICATIONS

This application claims the benefit of U.S. Provisional Patent Application 62/396,472, filed Sep. 19, 2016, whose disclosure is incorporated herein by reference.

FIELD OF THE DISCLOSURE

The present disclosure relates generally to analog-to-digital converters, and particularly to methods and systems for successive-approximation analog-to-digital conversion.

BACKGROUND

Successive Approximation (SA) is a popular analog-to-digital conversion scheme. Various types of SA Analog-to-Digital Converters (ADCs) are known in the art. For example, Chen et al. describe a power-efficient Signal-to-Noise Ratio (SNR) enhancement for SA ADCs, in "A 10.5-b ENOB 645 nW 100 kS/s SAR ADC with Statistical Estimation Based Noise Reduction," Proceedings of the 2015 IEEE Custom Integrated Circuits Conference (CICC), San Jose, Calif., Sep. 28-30, 2015.

A SAR ADC configuration having two comparators is described by Giannini et al., in "An 820 uW 9b 40 MS/s Noise-Tolerant Dynamic-SAR ADC in 90 nm Digital CMOS," IEEE International Solid-State Circuits Conference (ISSCC) Digest of Technical Papers, February, 2008, pages 238-239.

Venca et al. describe another SAR ADC configuration, in "A 0.076 mm2 12b 26.5 mW 600 MS/s 4×-Interleaved Subranging SAR-ΔΣ ADC with On-Chip Buffer in 28 nm CMOS," IEEE International Solid-State Circuits Conference (ISSCC) Digest of Technical Papers, February, 2016, pages 470-471. Yet another SAR ADC scheme is described by Liu et al., in "A 10 bit 320 MS/s Low-Cost SAR ADC for IEEE 802.11ac Applications in 20 nm CMOS," IEEE Journal of Solid-State Circuits, Volume 50, No. 11, November 2015.

The description above is presented as a general overview of related art in this field and should not be construed as an admission that any of the information it contains constitutes prior art against the present patent application.

SUMMARY

An embodiment that is described herein provides an Analog-to-Digital Converter (ADC) device including an input interface and conversion circuitry. The input interface is configured to receive an analog input signal. The conversion circuitry is configured to convert the analog input signal into a digital word by performing a sequence of iterations to determine respective bits of the digital word, wherein the sequence (i) progresses in descending order of bit significance of the bits, from a Most Significant Bit (MSB) to a Least Significant Bit (LSB), and (ii) repeats evaluation of a predefined number of Least-Significant Bits (LSBs) of the digital word multiple times, and determining a final value of the digital word by averaging the repeatedly-evaluated LSBs.

In an embodiment, the conversion circuitry includes a comparator configured to compare the analog input signal to an analog value produced from the digital word, and the conversion circuitry is configured to repeat the evaluation of the LSBs by reading an output of the comparator at multiple different times, to average a noise caused by the comparator. In an example embodiment, the conversion circuitry is configured to produce at least one of the LSBs of the digital word as a fractional bit, having a finer amplitude resolution than an output amplitude resolution provided by the ADC device.

In a disclosed embodiment, the conversion circuitry is configured to average the repeatedly-evaluated LSBs by applying to the repeatedly-evaluated LSBs respective weights. In some embodiments, the conversion circuitry comprises a Successive Approximation Register (SAR) controller configured to store the digital word, a Digital-to-Analog Converter (DAC) configured to convert the digital word stored in the SAR controller into an analog value, and a comparator configured to compare the analog value provided by the DAC to a predefined reference value so as to produce a comparator output, and the conversion circuitry is configured, in each of the iterations, to test a respective bit of the digital word by setting one or more values for the respective bit in the SAR controller, reading the comparator output produced in response to the one or more values, and setting a value of the respective bit based on the comparator output.

There is additionally provided, in accordance with an embodiment that is described herein, a method for analog-to-digital conversion. The method includes receiving an analog input signal to be converted into a digital word, and performing a sequence of iterations to determine respective bits of the digital word. The sequence (i) progresses in descending order of bit significance of the bits, from a Most Significant Bit (MSB) to a Least Significant Bit (LSB), and (ii) repeats evaluation of a predefined number of Least-Significant Bits (LSBs) of the digital word multiple times. A final value of the digital word is determined by averaging the repeatedly-evaluated LSBs.

The present disclosure will be more fully understood from the following detailed description of the embodiments thereof, taken together with the drawings in which:

BRIEF DESCRIPTION OF THE DRAWINGS

FIG. 3 is a diagram showing signal timing in the LSB section of FIG. 2, in accordance with an embodiment that is described herein; and FIG. 4 is a flow chart that schematically illustrates a method for analog-to-digital conversion using LSBs averaging, in accordance with an embodiment that is described herein.

DETAILED DESCRIPTION OF EMBODIMENTS

Figure 1:
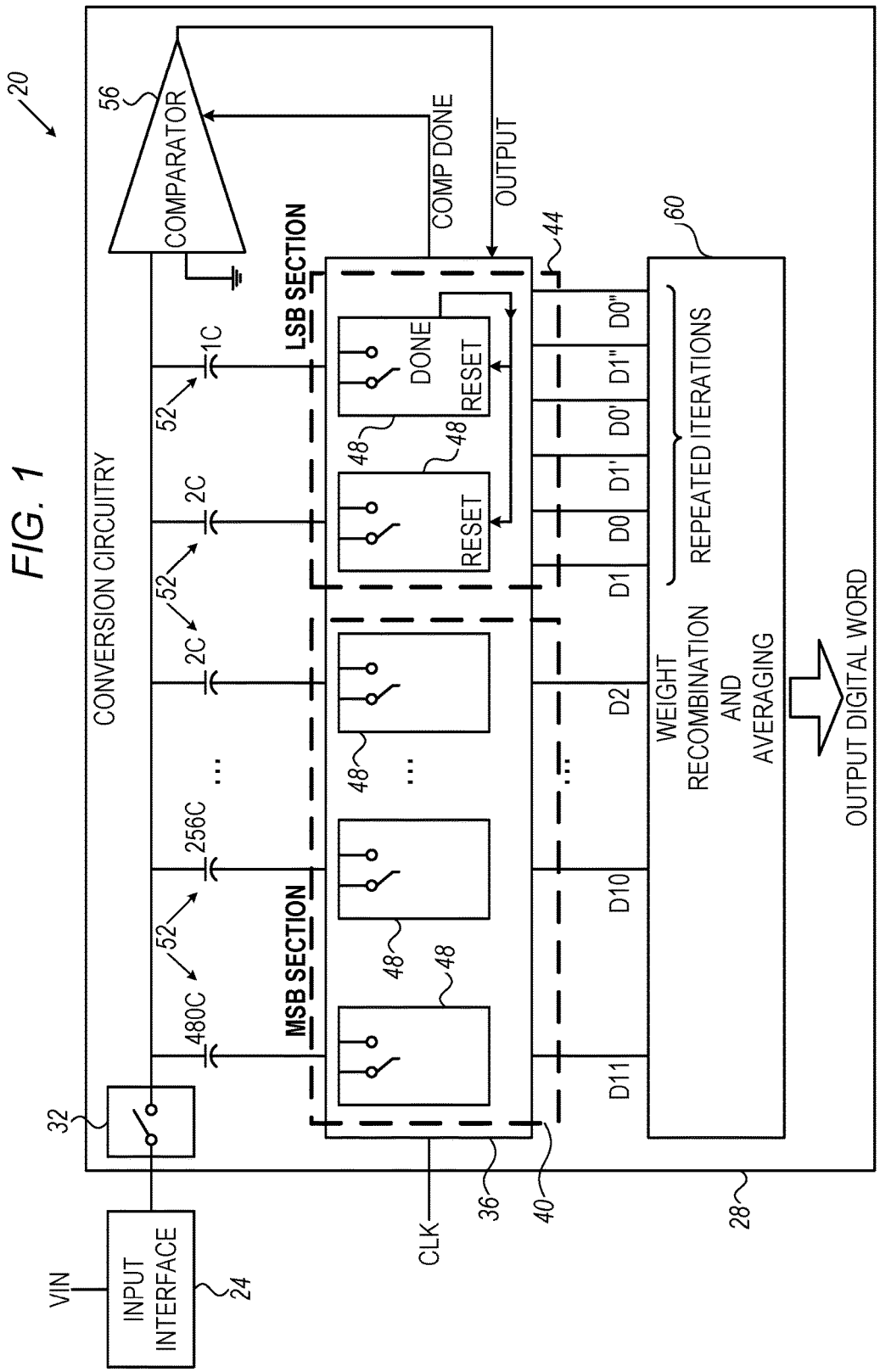
FIG. 1 is a block diagram that schematically illustrates an Analog-to-Digital Converter (ADC) that uses Least-Significant-Bits (LSBs) averaging, in accordance with an embodiment that is described herein.

Embodiments that are described herein provide improved Successive Approximation (SA) Analog-to-Digital Converters (ADCs) and associated methods.

In some embodiments, a SA ADC is configured to convert an analog input signal into a digital word, by performing a sequence of iterations that progresses in descending order of bit significance of the bits of the digital word, from a Most Significant Bit (MSB) to a Least Significant Bit (LSB), and successively determines the respective bit values.

The SA ADC typically comprises a Successive Approximation Register (SAR) controller, a Digital-to-Analog Converter (DAC) and a comparator. The SAR is configured to store the interim values of the digital word during the sequence of iterations. The DAC is configured to convert the digital word stored in the SAR controller into an analog value. The comparator is configured to compare the analog value provided by the DAC to a reference value, so as to produce a comparator output. In each iteration in the sequence, the ADC tests a respective bit of the digital word by (i) setting this bit in the SAR controller to at least one of the possible bit values, (ii) reading the comparator output produced in response to the bit values, and (iii) setting the value of the respective bit based on the comparator output.

One major bottleneck of such a SA ADC design is the noise produced in the comparator. This noise distorts the comparator output, especially during evaluation of relatively low-significance bits, and may cause conversion errors, i.e., convergence to a sub-optimal digital word.

One possible solution to the above challenge is to use a low-noise comparator. Low-noise comparators, however, tend to be large and power-consuming. Another possible solution is to use one comparator for evaluating an MSB part of the digital word, and a separate comparator for evaluating the remaining LSB part of the digital word. This solution, however, is complex and requires calibration of possible offsets between the comparators.

In some embodiments that are described herein, the ADC reduces the impact of comparator noise by repeating the evaluation of a predefined number of LSBs of the digital word multiple times, and averaging the results of the repeated LSB evaluations. In some embodiments, the SAR controller is divided into an MSB section and an LSB section. The sequence of iterations comprises a single iteration for each bit in the MSB section, and N iterations for each bit in the LSB section, wherein N is an integer larger than one. An averaging circuit in the ADC receives the results of the various iterations, and averages the interim results of the LSB iterations so as to set the final digital word.

In an example embodiment, the digital word has a total of twelve raw bits, divided into ten MSBs and two LSBs, and N=3. In this example, the sequence has a total of sixteen iterations—10 iterations for setting the ten MSBs, and 3×2=6 iterations for setting the two LSBs.

In some embodiments, the ADC has internal conversion steps that generate redundant bits having a finer resolution than the resolution provided as output. In the example embodiment above, without LSBs averaging the internal conversion takes twelve steps, hence generating 12 raw bits, but the ADC outputs only a 10-bit digital word to the user after weight recombination. With LSBs averaging, the two LSBs are converted multiple times to average-out noise and other impairments that might otherwise distort the output digital word. This generates "fractional bits" to enhance ADC effective resolution. The combination of redundancy weighting and the disclosed LSBs averaging technique is particularly effective.

The disclosed ADC configurations achieve high dynamic range and Signal-to-Noise Ratio (SNR), while at the same time using small, low-cost and low-power comparators.

Example test results of the disclosed scheme are provided in U.S. Provisional Patent Application 62/396,472, cited above.

FIG. 1 is a block diagram that schematically illustrates an Analog-to-Digital Converter (ADC) 20 that uses Least-Significant-Bits (LSBs) averaging, in accordance with an embodiment that is described herein. In the present example, ADC 20 comprises an input interface 24 for receiving an analog input signal VIN, and conversion circuitry 28 that is configured to convert VIN into a digital word.

In the embodiment of FIG. 1, ADC 20 comprises a bootstrapping switch 32. Switch 32 is used for switching ADC 20 between two modes—a sampling mode and a conversion mode. Typically, the analog-to-digital conversion operation begins in the sampling mode, with bootstrapping switch 32 closed. In the sampling mode VIN charges a bank of capacitors in conversion circuitry 28, as explained in detail below. After charging, ADC 20 transitions to the conversion mode, with bootstrapping switch 32 open. In the conversion mode conversion circuitry 28 converts VIN into a digital word that best estimates the amplitude (e.g., voltage level) of VIN.

In the present example, the digital word provided as output by ADC 20 is a 10-bit word. Internally, however, conversion circuitry 28 converts VIN into a 12-bit word. The bits of the 12-bit word are denoted $\{d11, d10, d9, \ldots, d1, d0\}$. Bit d0 is referred to as the Least-Significant Bit (LSB), and d11 is referred to as the Most-Significant Bit (MSB).

Each bit is associated with a respective weight depending on the corresponding relative capacitor value. In the present embodiment, the ADC uses binary-scaled recombination weighting, as described, for example, by Liu et al., in "A 10 bit 320 MS/s Low-Cost SAR ADC for IEEE 802.11ac Applications in 20 nm CMOS," IEEE Journal of Solid-State Circuits, Volume 50, No. 11, November 2015, which is incorporated herein by reference. In this embodiment, for a bit sequence $(D11, D10, D9, \ldots, D1, D0)$, wherein $Di=0$ or $1$, and $i=0, 1, \ldots, 11$, and ignoring LSBs averaging, the overall input amplitude level that the bit sequence represents is $D11*480+D10*256+ \ldots +D1*2+D0*1$. The maximum level is 1023 and minimum level is 0, which is exactly the range of a 10-bit quantizer, although with 12 steps of conversion.

The role and importance of the LSBs averaging is addressed below. In alternative embodiments, any other suitable internal resolution (number of bits used for internal conversion of VIN) and any other suitable output resolution (number of bits in the digital word provided as output) can be used.

In some embodiments, conversion circuitry 28 comprises a Successive Approximation Register (SAR) controller 36, which comprises twelve switches 48 corresponding to the twelve bits $\{d11, d10, d9, \ldots, d1, d0\}$, respectively. SAR controller 48 is divided into an MSB section 40 and an LSB section 44. In the present example, MSB section 40 comprises ten switches 48 corresponding to the ten MSBs (bits $\{d11, d10, \ldots, d3, d2\}$), and MSB section 40 comprises two switches 48 corresponding to the two LSBs (bits $\{d1, d0\}$). Alternatively, however, any other suitable partitioning into LSB and MSB sections can be used, e.g., depending on the comparator noise level.

In an embodiment, conversion circuitry 28 further comprises a set of twelve capacitors 52. The capacitances of capacitors 52 are set as multiples of a basic capacitance unit denoted C. The capacitances approximate a binary sequence, except for the largest capacitor and the two smallest capacitors. In the present example the capacitances are $\{480C,$ 256C, 128C, 72C, 40C, 20C, 12C, 6C, 4C, 2C, 2C, 1C}. The largest capacitor connects the output of bootstrapping switch 32 to switch 48 of d11, the next-larger capacitor connects the output of switch 32 to switch 48 of d10, and so on. The last capacitor connects the output of bootstrapping switch 32 to switch 48 of d0.

Each switch 48 connects its respective capacitor either to a positive reference voltage VREF, or to a negative reference voltage −VREF, or to a middle reference voltage 0. The three switch positions are referred to as a "switched-in position" (connected to VREF), a "switched-out position" (connected to −VREF) and an "initial position" (connected to virtual ground).

In an embodiment, conversion circuitry 28 further comprises a comparator 56, for instance a differential amplifier that is configured to compare the voltage across capacitors 52 to some predefined voltage level, also referred to as virtual ground. Comparator 56 produces an output bit denoted OUTPUT, which indicates whether the voltage at the top plate of capacitors 52 is above or below the virtual ground.

In a typical flow of operations, conversion circuitry 28 initializes the sampling mode, by setting all switches 48 to the "initial" position and closing bootstrapping switch 32. In this mode all capacitors 52 are fully charged by VIN. Conversion circuitry 28 then transitions to the conversion mode by opening switch 32.

In the conversion mode, conversion circuitry 28 performs a sequence of Successive Approximation (SA) iterations. In the present example, SAR controller 36 is clocked by a clock signal denoted CLK, and conversion circuitry 28 performs one SA iteration per clock cycle.

The sequence of iterations progresses in descending order of the bits d11 . . . d0, from MSB to LSB. Each iteration checks whether the respective bit of the digital word should be set to "1" or "0". In the kth iteration, conversion circuitry 28 evaluates the output of comparator 56 to decide between one of two positions ("switched-in" or "switched-out") of the kth switch 48. Conversion circuitry 28 fixes the position of the kth switch 48 depending on the comparator output, and this value remains fixed for the subsequent iterations.

At the end of the sequence, the set of twelve positions of switches 48 define the twelve final values of bits d11, . . . , d0. These twelve bit values with their respective weights make-up the 12-bit digital word that best approximates the amplitude of VIN. When the sequence is completed, SAR controller 36 asserts a signal denoted COMP_DONE, which disables comparator 56.

At any stage during the sequence of SA iterations, the bank of capacitors 52 can be viewed as converting the digital word (the present values of {d11, . . . , d0}) back into an analog value (the aggregate charge level of all the switched-in capacitors in parallel) that is fed to comparator 56. The bank of capacitors 52 is therefore also referred to as a "capacitive digital-to-analog converter" (CDAC). Although the embodiments described herein refer mainly to CDAC, the disclosed techniques are applicable to other suitable types of DACs used in SA ADCs such as Resistive DACs (RDACs).

As noted above, one of the performance bottlenecks of SA ADCs is comparator noise. In some embodiments, conversion circuitry 28 reduces the impact of the noise of comparator 56 by evaluating the bits in LSB section 44 multiple times, and averaging the results. In some embodiments, the sequence of SA iterations in ADC 20 comprises a single iteration for each bit in MSB section 40, and N iterations for the bits of LSB section 36, wherein N is a predefined integer larger than one.

In the example of FIG. 1, the LSB section comprises two LSBs—d1 and d0. Conversion circuitry 28 evaluates the two LSBs three or two times, i.e., N=3 or N=2. The sequence in the example of FIG. 1, where N=3, thus consists of sixteen iterations:

The first ten iterations set the final values of d11, . . . , d2.
The $11^{th}$ and $12^{th}$ iterations produce interim values denoted D1,D0 for the two LSBs d1, d0.
The $13^{th}$ and $14^{th}$ iterations produce interim values denoted D1',D0' for the two LSBs d1, d0.
The $15^{th}$ and $16^{th}$ iterations produce interim values denoted D1'',D0'' for the two LSBs d1, d0.

In the example of FIG. 1, conversion circuitry 28 comprises a weight recombination and averaging circuit 60 that is configured to perform the LSBs averaging operation. Circuit 60 is referred to below simply as "averaging circuit" for brevity. Following the sequence of iterations, averaging circuit 60 averages the N interim results, so as to produce the final digital word. In the present example, averaging circuit 60 calculates an average of the three 2-bit words {D1,D0}, {D1',D0'} and {D1'',D0''}. The averaging result is used as the final setting of LSBs d1 and d0. In an embodiment, averaging circuit 60 comprises a shift register (not seen in the figure) that temporarily holds the N interim results ({D1,D0}, {D1',D0'} and {D1'',D0''}) during the averaging operation.

Each of the interim results is obtained at a different point in time. As such, the noise of comparator 56 can be assumed to be mostly uncorrelated among different interim results. Therefore, the averaging operation reduces the potential distortion or errors in the output digital word due to comparator noise.

As noted above, ADC 20 provides as output only a 10-bit digital word (after weight recombination) from the 12-bit digital word that is available internally. Typically, following averaging by circuit 60, conversion circuitry 28 provides as output the ten MSBs with redundancy. As a result, higher resolution is achieved with two LSBs averaging.

In various embodiments, averaging circuit 60 may calculate any suitable type of average over the N interim results. In one example embodiment, averaging circuit 60 averages the interim results by calculating:

$$\text{Code}_{Decimal} = \sum_{i=2}^{11} D_i w_i + \sum_{i=0}^{1} \frac{1}{N} D_i w_i \qquad \text{Equation 1}$$

wherein $\text{Code}_{Decimal}$ denotes the 10-bit output digital word, and $w_i$ denote twelve respective weights assigned to the twelve bits D11, . . . , D0.

The second term in Equation 1 above represents the averaging of the fractional bits. In the present example, in which N=3, the division by N may generally produce a result having an infinite number of bits. In another embodiment, the number of repetitions N is set to an integer power of two, e.g., N=2 or N=4.

Figure 2:
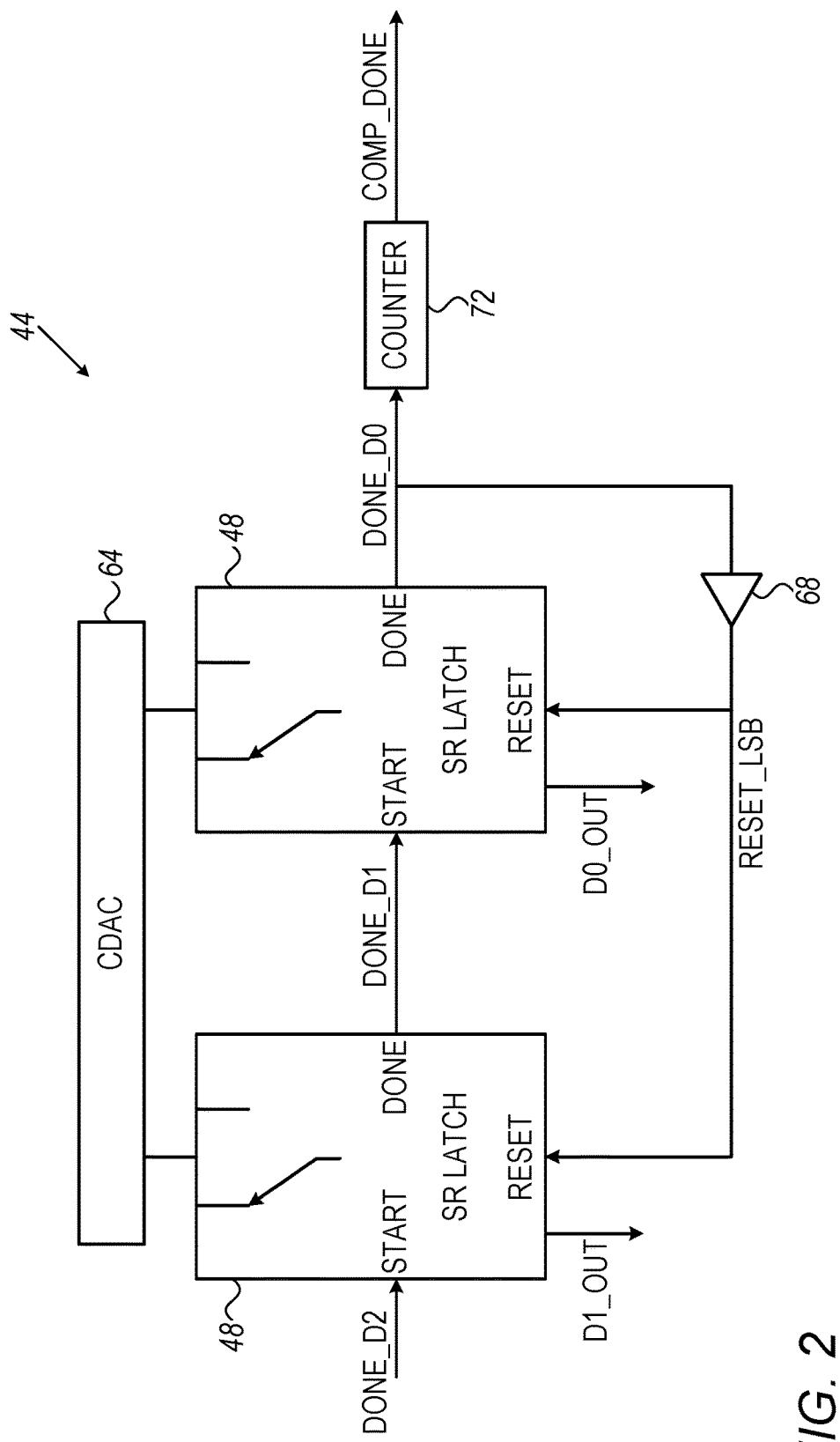
FIG. 2 is a block diagram that schematically illustrates an LSB section of the ADC of FIG. 1, in accordance with an embodiment that is described herein.

FIG. 2 is a block diagram that schematically illustrates LSB section 44 of ADC 20 in greater detail, in accordance with an embodiment that is described herein. In this embodiment switches 48 are implemented using Shift-Register (SR) latches. Both switches 48 are connected to a CDAC 64 (the bank of capacitors 52 seen in FIG. 1).

Switch 48 of bit d1 is triggered by an input signal DONE_D2, which is received from MSB section 40 and indicates that the previous iteration (which set the values of d2) has been completed. When the iteration that sets the value of d1 is completed, the switch 48 of d1 is set to its final setting, and a signal DONE_D1 is asserted. The DONE_D1 signal triggers switch 48 of d0, i.e., triggers the next iteration that finds the value of d0. The values of d1 and d0 are provided to averaging circuit 60 as latch outputs denoted D1_OUT and D0_OUT, respectively. When the iteration that finds the value of d0 ends, the switch 48 of d0 asserts a signal DONE_D0.

The process above, of estimating the values of d1 and d0, is repeated N times. The DONE_D0 signal is fed back via a buffer 68 and used to reset the two switches 48 (using a reset signal denoted RESET_LSB). The reset causes the last two iterations to be repeated. A counter 72 counts these repetitions. When N repetitions have been performed, counter 72 stops the repetitions and asserts the COMP_DONE signal (which deactivates comparator 56—see FIG. 1).

In the present example, counter 72 counts three repetitions. The first repetition produces D1, D0 on D1_OUT, D0_OUT, the second repetition produces D1',D0' on D1_OUT,D0_OUT, and the third repetition produces D1", D0" on D1_OUT,D0_OUT. The six values are provided to averaging circuit 60 (see FIG. 1) for averaging the result.

FIG. 3 is a diagram showing signal timing in LSB section 44 of FIG. 2, in accordance with an embodiment that is described herein. Signal CLK_C is the conversion phase. The bottom signal ("LSBs Digital Code") conveys the interim results D1, D0, D1', D0', D1" and D0" to averaging circuit 60. The other signals correspond to the description of FIG. 2 above. The three repetitions are seen clearly in the diagram.

The configuration of ADC 20, and its components such as LSB section 44, as shown in FIGS. 1 and 2, are example configurations that are depicted solely for the sake of clarity. In alternative embodiments, any other suitable configurations can be used. Circuit elements that are not mandatory for understanding of the disclosed techniques have been omitted from the figures for the sake of clarity.

The different elements of ADC 20 may be implemented using dedicated hardware, such as using hard-wired or programmable logic, e.g., in an Application-Specific Integrated Circuit (ASICs) or Field-Programmable Gate Array (FPGA). In an example embodiment, ADC 20 is implemented in a 28 nm Complementary Metal-Oxide Semiconductor (CMOS) process. In this embodiment, the sampling rate of ADC 20 is 160M samples per second. In alternative embodiments, any other suitable manufacturing process and sampling rate can be used. In an embodiment, ADC 20 is fabricated on several dies, which are packaged in the same device package. In another embodiment, the entire ADC 20 is fabricated on a single die.

FIG. 4 is a flow chart that schematically illustrates a method for analog-to-digital conversion using LSBs averaging, in accordance with an embodiment that is described herein. The method begins with input interface 24 of ADC 20 receiving analog input signal VIN, at an input operation 80. At a conversion operation 84, conversion circuitry 28 converts VIN into a digital word in a sequence of Successive Approximation (SA) iterations. As described above, the sequence evaluates a predefined number of LSBs multiple times. At a post-processing operation 88, weight recombination and averaging circuit 60 averages and combines the interim results and determines the final 10-bit digital word as the output of ADC 20, at an output operation 92.

Although the embodiments described herein mainly address comparator noise suppression in SARADC with capacitive DAC, the methods and systems described herein can also be used in other applications, such as in resistive DAC or other types of ADC.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Analog-to-Digital Converter (ADC) device, comprising:
   an input interface, configured to receive an analog input signal; and
   conversion circuitry, configured to convert the analog input signal into a digital word, by:
      performing a sequence of iterations to determine respective bits of the digital word, wherein the sequence (i) progresses in descending order of bit significance of the bits, from a Most Significant Bit (MSB) to a Least Significant Bit (LSB), and (ii) repeats evaluation of a predefined number of Least-Significant Bits (LSBs) of the digital word multiple times; and
      determining a final value of the digital word by averaging the repeatedly-evaluated LSBs.

2. The ADC device according to claim 1,
   wherein the conversion circuitry comprises a comparator configured to compare the analog input signal to an analog value produced from the digital word; and
   wherein the conversion circuitry is configured to repeat the evaluation of the LSBs by reading an output of the comparator at multiple different times, to average a noise caused by the comparator.

3. The ADC device according to claim 1, wherein the conversion circuitry is configured to produce at least one of the LSBs of the digital word as a fractional bit, having a finer amplitude resolution than an output amplitude resolution provided by the ADC device.

4. The ADC device according to claim 1, wherein the conversion circuitry is configured to average the repeatedly-evaluated LSBs by applying to the repeatedly-evaluated LSBs respective weights.

5. The ADC device according to claim 1, wherein the conversion circuitry comprises:
   a Successive Approximation Register (SAR) controller configured to store the digital word;
   a Digital-to-Analog Converter (DAC) configured to convert the digital word stored in the SAR controller into an analog value;
   a comparator, configured to compare the analog value provided by the DAC to a predefined reference value, so as to produce a comparator output, and
   wherein the conversion circuitry is configured, in each of the iterations, to test a respective bit of the digital word by setting one or more values for the respective bit in the SAR controller, reading the comparator output produced in response to the one or more values, and setting a value of the respective bit based on the comparator output.

6. A method for analog-to-digital conversion, comprising:
receiving an analog input signal to be converted into a digital word;
performing a sequence of iterations to determine respective bits of the digital word, wherein the sequence (i) progresses in descending order of bit significance of the bits, from a Most Significant Bit (MSB) to a Least Significant Bit (LSB), and (ii) repeats evaluation of a predefined number of Least-Significant Bits (LSBs) of the digital word multiple times; and
determining a final value of the digital word by averaging the repeatedly-evaluated LSBs.

7. The method according to claim 6, wherein performing the sequence of iterations comprises applying a comparator to compare the analog input signal to an analog value produced from the digital word, and repeating the evaluation of the LSBs by reading an output of the comparator at multiple different times, to average a noise caused by the comparator.

8. The method according to claim 6, wherein performing the sequence of iterations comprises producing at least one of the LSBs of the digital word as a fractional bit, having a finer amplitude resolution than an output amplitude resolution provided as output of the analog-to-digital conversion.

9. The method according to claim 6, wherein performing the sequence of iterations comprises averaging the repeatedly-evaluated LSBs by applying to the repeatedly-evaluated LSBs respective weights.

* * * * *